United States Patent
Kong et al.

(10) Patent No.: US 10,998,261 B2
(45) Date of Patent: May 4, 2021

(54) OVER-MOLDED IC PACKAGE WITH IN-MOLD CAPACITOR

(71) Applicant: Intel Corporation, Santa Clara, CA (US)

(72) Inventors: Jackson Chung Peng Kong, Tanjung Tokong (MY); Bok Eng Cheah, Gelugor (MY); Wen Wei Lum, Sungai Petani (MY); Mooi Ling Chang, Bayan Lepas (MY); Ping Ping Ooi, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/974,493

(22) Filed: May 8, 2018

(65) Prior Publication Data

US 2018/0358292 A1    Dec. 13, 2018

(30) Foreign Application Priority Data

Jun. 8, 2017 (MY) .......................... PI2017702125

(51) Int. Cl.
| | | |
|---|---|---|
| *H01L 23/522* | (2006.01) | |
| *H01L 23/00* | (2006.01) | |
| *H01L 23/31* | (2006.01) | |
| *H01L 23/498* | (2006.01) | |
| *H01L 21/56* | (2006.01) | |

(52) U.S. Cl.
CPC .......... *H01L 23/5223* (2013.01); *H01L 21/56* (2013.01); *H01L 23/315* (2013.01); *H01L 23/3128* (2013.01); *H01L 23/498* (2013.01); *H01L 24/09* (2013.01); *H01L 2224/0233* (2013.01)

(58) Field of Classification Search
None
See application file for complete search history.

(56) References Cited

U.S. PATENT DOCUMENTS

| | | | | |
|---|---|---|---|---|
| 6,441,419 B1 * | 8/2002 | Johnson | ............ | H01L 21/76838 257/296 |
| 6,964,584 B2 * | 11/2005 | Zhong | ................ | H01R 13/6625 439/620.21 |
| 7,173,803 B2 * | 2/2007 | Zhong | .................... | H01G 4/232 257/E23.079 |
| 7,670,921 B2 * | 3/2010 | Chinthakindi | ......... | H01G 4/005 438/398 |

(Continued)

*Primary Examiner* — David E Graybill
(74) *Attorney, Agent, or Firm* — Green, Howard & Mughal LLP.

(57) ABSTRACT

Over-molded IC package assemblies including an in-mold capacitor. In some embodiments, an over-molded package assembly includes a IC chip or die coupled to one or more metal distribution layer or package substrate. A molding compound encapsulates at least the IC chip and one or more capacitors are fabricated within the molding compound. The capacitors may include two or more metal plates separated by an intervening dielectric material, all of which are embedded within a trench in the molding compound. Individual ones of the capacitor plates may physically contact a conductive land of the package redistribution layer or package substrate, for example to tie the plates to a ground plane and power plane, or two supply rails, in a decoupling capacitor application.

8 Claims, 8 Drawing Sheets

(56) References Cited

U.S. PATENT DOCUMENTS

| | | | | |
|---|---|---|---|---|
| 7,906,856 B2* | 3/2011 | Ishio | H01L 23/3114 | 257/780 |
| 7,989,270 B2* | 8/2011 | Huang | H01L 23/50 | 438/127 |
| 8,159,047 B2* | 4/2012 | Huang | H01L 23/50 | 257/532 |
| 8,476,120 B2* | 7/2013 | Huang | H01L 23/50 | 438/127 |
| 8,653,626 B2* | 2/2014 | Lo | H01L 23/49816 | 257/532 |
| 8,928,114 B2* | 1/2015 | Chen | H01L 23/481 | 257/532 |
| 9,153,641 B2* | 10/2015 | Lee | H01L 23/5223 | |
| 9,165,793 B1* | 10/2015 | Wang | H01L 24/32 | |
| 9,165,887 B2* | 10/2015 | Hsiao | H01L 21/4853 | |
| 9,257,332 B2* | 2/2016 | Chen | H01L 21/486 | |
| 9,258,922 B2* | 2/2016 | Chen | H01L 23/49827 | |
| 9,412,806 B2* | 8/2016 | Wang | H01L 28/65 | |
| 9,508,638 B2* | 11/2016 | Wang | H01L 24/05 | |
| 9,543,278 B2* | 1/2017 | Hsiao | H01L 21/486 | |
| 9,576,821 B2* | 2/2017 | Lo | H01L 23/49816 | |
| 9,831,302 B2* | 11/2017 | Wang | H01L 21/4853 | |
| 9,865,675 B2* | 1/2018 | Wang | H01L 28/65 | |
| 9,941,195 B2* | 4/2018 | Liao | H01G 4/306 | |
| 10,008,479 B2* | 6/2018 | Hsiao | H01L 21/6835 | |
| 10,229,873 B2* | 3/2019 | Kim | H01L 23/5223 | |
| 2004/0209518 A1* | 10/2004 | Zhong | H01G 4/232 | 439/620.09 |
| 2006/0054994 A1* | 3/2006 | Harris | H01L 23/5223 | 257/532 |
| 2007/0191719 A1* | 8/2007 | Yamashita | A61B 5/0002 | 600/503 |
| 2008/0272500 A1* | 11/2008 | Ishio | H01L 23/3114 | 257/782 |
| 2010/0171199 A1* | 7/2010 | Uchida | G03F 7/094 | 257/642 |
| 2010/0181285 A1* | 7/2010 | Tanaka | H01G 4/232 | 216/17 |
| 2010/0230806 A1* | 9/2010 | Huang | H01L 23/50 | 257/723 |
| 2010/0265682 A1* | 10/2010 | Martinez | H01L 23/49816 | 361/782 |
| 2011/0233726 A1* | 9/2011 | Huang | H01L 23/50 | 257/532 |
| 2012/0095529 A1* | 4/2012 | Parramon | A61N 1/025 | 607/59 |
| 2012/0168963 A1* | 7/2012 | Huang | H01L 23/50 | 257/774 |
| 2013/0181325 A1* | 7/2013 | Chen | H01L 21/76898 | 257/532 |
| 2013/0182402 A1* | 7/2013 | Chen | H01L 23/49827 | 361/807 |
| 2014/0021583 A1* | 1/2014 | Lo | H01L 23/49816 | 257/532 |
| 2014/0070422 A1* | 3/2014 | Hsiao | H01L 23/49816 | 257/774 |
| 2014/0127866 A1* | 5/2014 | Lo | H01L 23/49816 | 438/127 |
| 2014/0206154 A1* | 7/2014 | Coffy | H01L 24/18 | 438/127 |
| 2014/0354745 A1* | 12/2014 | Miyamoto | H01L 27/1292 | 347/102 |
| 2015/0093881 A1* | 4/2015 | Chen | H01L 21/486 | 438/460 |
| 2016/0058324 A1* | 3/2016 | Cao | A61B 5/7282 | 600/302 |
| 2016/0111398 A1* | 4/2016 | Hsiao | H01L 21/4857 | 257/534 |
| 2016/0133686 A1* | 5/2016 | Liao | H01G 4/306 | 257/532 |
| 2016/0287886 A1* | 10/2016 | Parramon | A61N 1/08 | |
| 2017/0125386 A1* | 5/2017 | Hsiao | H01L 23/3142 | |
| 2018/0226338 A1* | 8/2018 | Kim | H01L 23/5223 | |
| 2018/0358292 A1* | 12/2018 | Kong | H01L 23/5223 | |

\* cited by examiner

OVER-MOLDED IC PACKAGE WITH IN-MOLD CAPACITOR

PRIORITY CLAIM

This Application claims priority to MY Patent Application No. PI 2017702125, filed on 8 Jun. 2017 and titled "OVER-MOLDED IC PACKAGE WITH IN-MOLD CAPACITOR", which is incorporated by reference in its entirety for all purposes.

BACKGROUND

Capacitors suitable for decoupling power supply noise from an integrated circuit (IC) are passive components important to closely interconnect with the IC. The trend in IC packaging is to reduce the package form factor. Recent examples include chip-scale packages that leverage wafer-level packaging techniques. To date however, the large footprint of conventional decoupling capacitors poses challenges for such ultra-small form factor packaging technology.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Over-molded IC package assemblies including an "in-mold" or "embedded" capacitor are described below. Techniques to form such package structures are also described below. In some embodiments, an over-molded package assembly includes a IC chip or die coupled to one or more metal distribution layers, or a package substrate. A molding compound encapsulates at least the IC chip and one or more conductive plates of a capacitor are embedded within the molding compound. These conductive plates may be located in a peripheral portion of the molding compound over the distribution layer or package substrate. In some embodiments, the capacitor comprises two, three, or more conductive features, such as thick traces operable as vertically-oriented capacitor plates, which may physically contact a conductor within the metal distribution layers, or exposed on the substrate. In some further embodiments, the conductive features of the capacitor may be physically separated from each other by a dielectric material of a desired relative permittivity.

Figure 1:
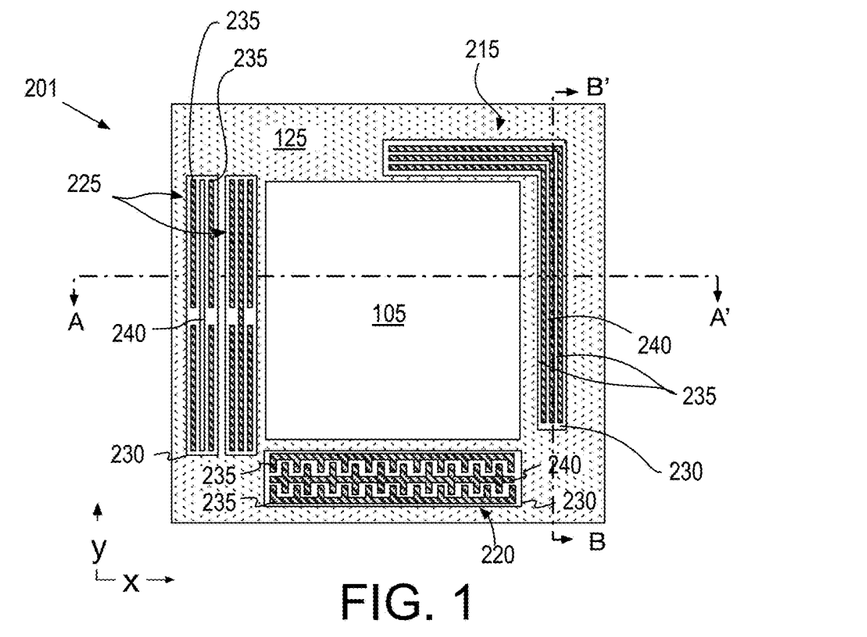
FIG. 1 is a top-down plan view of an over-molded package assembly with in-mold capacitors, in accordance with some embodiments.

FIG. 1 is a top-down plan view of an IC in an over-molded package assembly 201, in accordance with some embodiments. Over-molded package assembly 201 includes at least one IC chip 105 embedded in a molding compound 125. IC chip 105 may be of any architecture and operable for any function(s), such as, but not limited to, a memory IC, a logic IC, a power IC, or a system-on-chip (SOC). A logic IC in this context may be a microprocessor, for example a central processor, a graphics processor, or a field programmable gate array. IC chip 105 may also be a photonic, electromagnetic (e.g., buck-boost power supply, etc.), or MEMS device (e.g., with magnetically or capacitively coupled released members, etc.) Molding compound 125 may be any material known to be suitable for over-molded IC packages, such as, but not limited to, an epoxy resin (e.g., an acrylate of novolac), silicone, or composite thereof.

Over-molded package assembly 201 includes at least one capacitor embedded within molding compound 125. Unlike SMT capacitors, which may be encapsulated by a molding compound (i.e., over-molded in the same manner as IC chip 105), embedded capacitors in accordance with some embodiments herein are fabricated within a trench in the molding compound. FIG. 1 illustrates some exemplary capacitors 215, 220, and 225 embedded within a peripheral portion of molding compound 125 beyond an edge of IC chip 105. Capacitor 215 includes a first conductive plate 240 between second and third conductive plates 235. An intervening capacitor dielectric material 230 separates conductive plates 235 and 240 from each other. Although illustrated with three plates, embedded capacitors in accordance with some embodiments may have two plates or more than three plates (e.g., five, seven, nine, eleven plates, etc.). Capacitor 215 extends adjacent to two edges of IC chip 105, continuously surrounding a corner of IC chip 105 with a first plate length extending in the y-dimension and a second plate length extending in the x-dimension). Capacitor 220 illustrates another exemplary embodiment where plates 235 and 240 include interdigitated fingers, increasing plate area for the footprint of capacitor 220 relative to the linear/parallel plate configuration of capacitor 215. Capacitors 225 illustrate an exemplary embodiment where multiple capacitors having separate plates 235 share a common first plate 240. Hence, depending on the area of the peripheral portion of molding compound 125, one or more capacitors may be embedded adjacent to an edge of IC chip 105.

In some advantageous embodiments, conductive plates 235 and 240 include one or more elemental metal or metal alloy occupying a portion of the trench within molding compound 125. In one exemplary embodiment, conductive plates 235 and 240 are Cu, or an alloy thereof. Capacitor dielectric material 230 may be of a different composition than molding compound 125. In some embodiments, dielectric material 230 has a relative permittivity many orders of magnitude higher than that of molding compound 125. In some advantageous embodiments, dielectric material 230 is a high-k material, for example having a relative permittivity of 10,000-15,000. In one specific embodiment, dielectric material 230 comprises calcium copper titanium oxide (CCTO). In another specific embodiment, dielectric material 230 comprises barium titanate.

Figure 2:
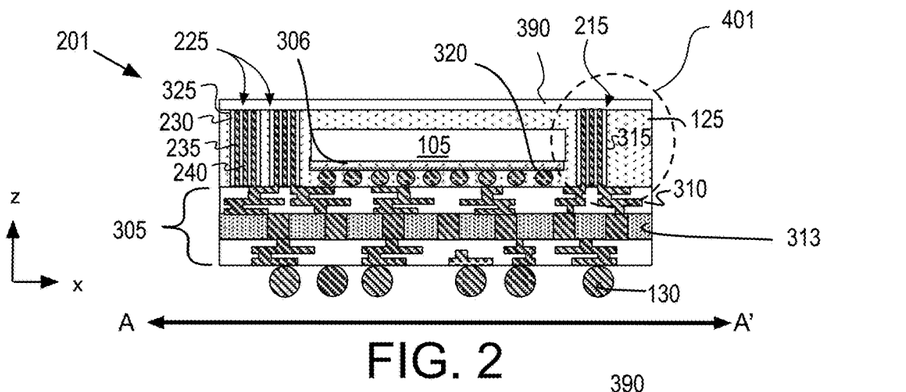
FIG. 2 is a first cross-sectional view of the over-molded package assembly illustrated in FIG. 2, in accordance with some embodiments.

FIG. 2 is a cross-sectional view of over-molded package assembly 201, in accordance with some embodiments. The sectional view shown in FIG. 2 is along the dashed A-A' line denoted in FIG. 1. As shown in FIG. 2, over-molded package assembly 201 includes a package substrate 305. Embedded capacitors 215, 225 are located within the peripheral portion of molding compound 125 that extends over package substrate 305. Substrate 305 may be any substrate known to be suitable for one or more of flip-chip packages (FCBGA), package-on-package (PoP), system-in-package (SiP), or the like. In some embodiments, package substrate 305 comprises a laminate of electrical routing metallization 310 embedded within dielectric build-up layers deposited on one or more sides of a core 313 (e.g., FR-5 glass and epoxy or bismaleimide-triazine resin). A first side of IC chip 105 that includes circuitry 306 may be attached, for example with any flip-chip technique, to substrate 305. IC chip 105 may be electrically interconnected to package substrate 305 by solder features 320 (e.g., micro-bumps, posts, etc.), wire bonds, lead frames, or any other suitable packaging interconnect architecture. Package substrate 305 may then be coupled to a host substrate (not depicted) through solder BGA 130, which may comprises solder balls of any suitable alloy, such as, but not limited to, a Sn—Ag—Cu (SAC) alloy (e.g., "SAC 305" or "SAC 405").

As shown in FIG. 2, molding compound 125 encapsulates a second side of IC chip 105 (e.g., the back side) and forms a perimeter surrounding the sidewall edges of IC chip 105. IC chip 105 may have any thickness, with an exemplary thickness range being 50-300 μm. At the periphery of IC chip 105, molding compound 125 has a thickness at least equal to that of IC chip 105 (e.g., 50-300 μm). In some embodiments, molding compound 125 has a non-zero thickness over IC chip 105. In the illustrated example where the surface of molding compound 125 is substantially planar (e.g., the of the molding compound surface has a z-dimensional height relative to a surface of substrate 305 that is substantially the same between the peripheral region and over chip 105), the molding compound thickness over IC chip 105 is less than the molding compound thickness at the chip periphery. In the illustrated example, metal plates 235, 240 have a vertical (e.g., z-axis) height that is approximately equal to the thickness of molding compound 125 within the peripheral region. Metal plates 235, 240, being adjacent to each other, form a horizontally-oriented capacitor in contrast to a discrete capacitor (e.g., multi-layer ceramic capacitor) comprising a stack of capacitor plates.

In some embodiments, rather than IC chip 105 being mounted to package substrate 305, one or more metal redistribution layers (not depicted) may be built up on a surface of circuitry 306 and capacitors embedded in molding compound in substantially the same manner illustrated in FIGS. 1 and 2 so as to make contact with a first layer of the metal redistribution layer. The metal redistribution layers may be embedded in any suitable build-up dielectric material, such as but not limited to, organic dielectric dry-laminate films. Rather than employing solder features 320, the metal redistribution layers may make contact with surface-finished regions of circuitry 306 using a bumpless technology. Metal redistribution layers may be any metal, such as, but not limited to, copper (Cu) and alloys thereof that may, for example be plated up from circuitry 306. Capacitors may be embedded within the portion of the molding compound that extends over the metal redistribution layers at the periphery of the IC chip in substantially the same manner illustrated in FIG. 2.

In some embodiments, an over-molded IC package assembly includes one or more vias and/or trenches passing through a thickness of the molding compound and embedded capacitors are contained within these vias and/or trenches. As shown in the sectional view of FIG. 2, capacitors 215 and 225 reside within separate trenches 315 and 325 that are separated by residual molding compound 125. As shown in FIGS. 1 and 2, dielectric material 230 lines trenches 315, 325. Metal plates 235, 240 are further embedded within dielectric material 230. In the sectional view shown in FIG. 2, metal plates 235, 240 extend through the entire thickness of molding compound 125. In some embodiments, one or more such "through-mold" vias or trenches make direct contact to a conductive surface of substrate 305 (or directly contact a metal redistribution layer). For such embodiments, separate plates of the embedded capacitor may be directly coupled through a conductive contact to a voltage reference plane (e.g., power or ground) conveyed by the particular one(s) of the package substrate traces.

Figure 4:
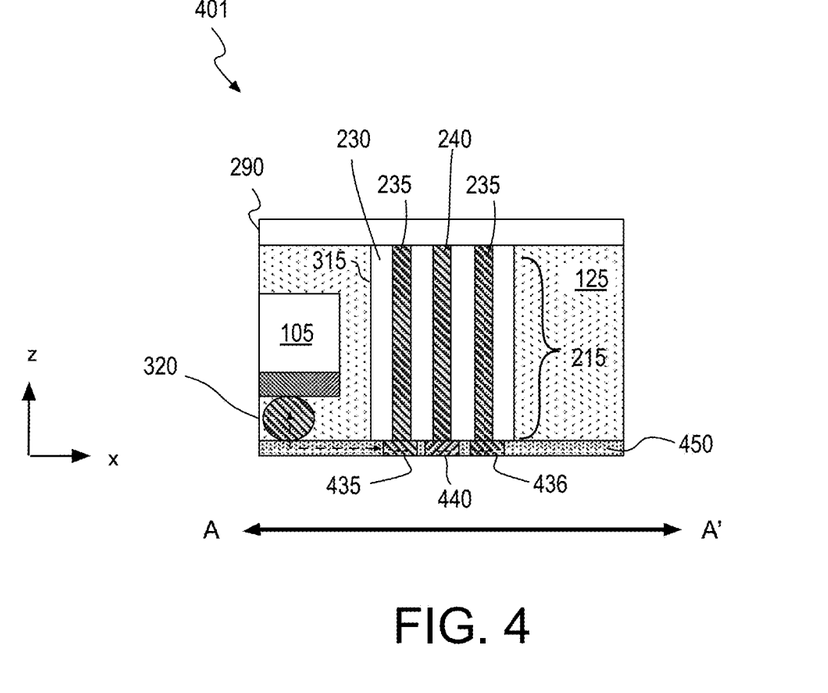
FIG. 4 is an expanded cross-section view of the over-molded package assembly illustrated in FIG. 2, in accordance with some embodiments.

FIG. 4 illustrates an expanded view of the region 401 highlighted by dashed line in FIG. 2. As shown in FIG. 4, trench 315 exposes substrate lands 435, 436, 440, as well as package substrate dielectric material (e.g., solder resist) 450. Metal plate 240 makes direct contact to a first conductive package substrate land 440. Metal plates 235 make direct contact to additional conductive package substrate lands 435 and 436. Capacitor dielectric material 230 lines trench 315 and separates metal plates 240 and 235. Capacitor plates 235 and 240, being coupled to different substrate lands 435 and 440 may be maintained at different reference voltages. Metal plate 240 may therefore be maintained during the operation of IC chip 105 to a first package substrate reference voltage (e.g., ground, or $V_{ss}$) while one plate 235 may be concurrently biased to a second reference voltage (e.g., a first power rail, or $V_{cc}$) that is coupled to IC chip 105, for example along the dashed routing arrow representing a trace in a first package routing metallization layer that terminates at a solder feature (e.g., bump) 320. Likewise, the second plate 235 may be concurrently biased to a second reference voltage (e.g., a second power rail, or $V_{cc}$) that is coupled to IC chip 105 through another trace (not depicted) of the first package routing metallization layer that terminates at another solder feature (not depicted).

Figure 3:
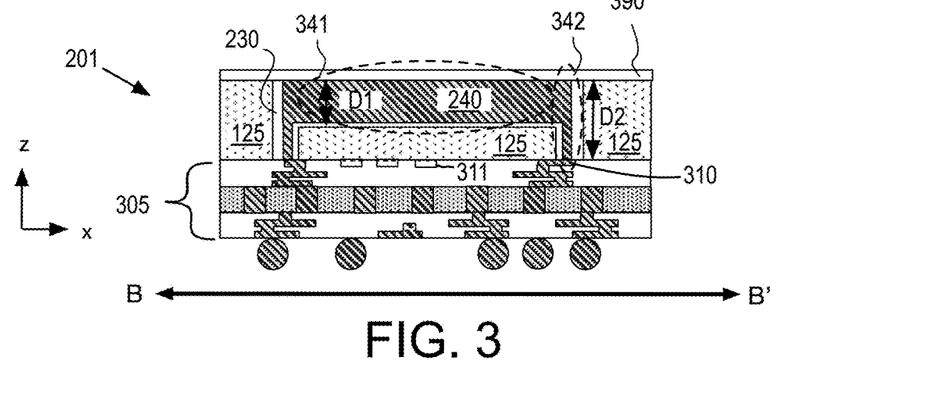
FIG. 3 is a second cross-sectional view of the over-molded package assembly illustrated in FIG. 2, in accordance with some embodiments.

In some exemplary embodiments, two opposite ends of each metal plate 235, 240 make direct contact to a conductive surface of substrate 305. FIG. 3 is a second cross-sectional view of the over-molded package assembly illustrated in FIG. 1, in accordance with some embodiments. The sectional view shown in FIG. 3 is along the dashed B-B' line denoted in FIG. 1. In the example illustrated in FIG. 3, metal plate 240 is continuous between its ends, which contact package routing metallization 310 at two locations. In this example, metal plate 240 has a first depth D1 over capacitor region 341 that is less than depth D2 within capacitor region 342 where electrical contact is made to substrate 305. With depth D1 less than depth D2, embedded capacitor 215 may extend over one or more first layer package substrate routing metallizations 311 without making electrical contact to first layer substrate routing metallizations 311. This flexibility may reduce the impact large capacitors have on signal trace (escape) routing from IC chip 105. Although in the embodiment illustrated in FIG. 3, depth D1 is less than the thickness of molding compound 125, depth D1 may be equal to the thickness of molding compound 125 where another intervening dielectric material on substrate 305 (e.g., solder resist) is relied upon to electrically isolate metal plate 240 from first layer substrate routing metallizations 311. In the embodiment shown in FIG. 3, molding compound 125 is present below capacitor region 341. Alternatively, molding compound may be absent between the metal plate 240 and substrate 305 even where depth D1 is less than the thickness of molding compound. For example, the region between metal plate 240 and substrate 305 may instead be occupied by capacitor dielectric material 230. In still other embodiments, where depth D1 is equal to D2 and there is no molding compound or capacitor dielectric material 230 between metal plate 240 and substrate 305, a layer of solder resist (not depicted) may be all that separates metal plate 240 from first layer substrate routing metallizations 311.

In some embodiments, an over-molded IC package may include one or more protective layers over capacitors embedded in a molding compound. In FIG. 2, for example, IC package assembly 201 includes a protective layer 390 encapsulating metal plates 240, 235 Protective layer 390 may be any dielectric material and have a composition distinct from molding compound 125. Protective layer 390 may be, for example, an organic dry-laminate film or solder resist (e.g., SU-8 resist, etc.).

Figure 5A:
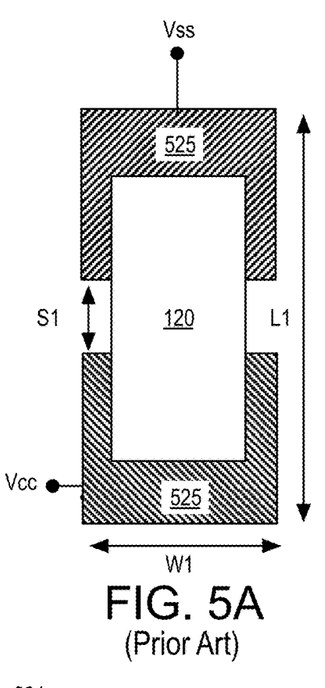
FIG. 5A is a schematic illustrating the footprint of die-side capacitors, in accordance with convention.
Figure 5B:
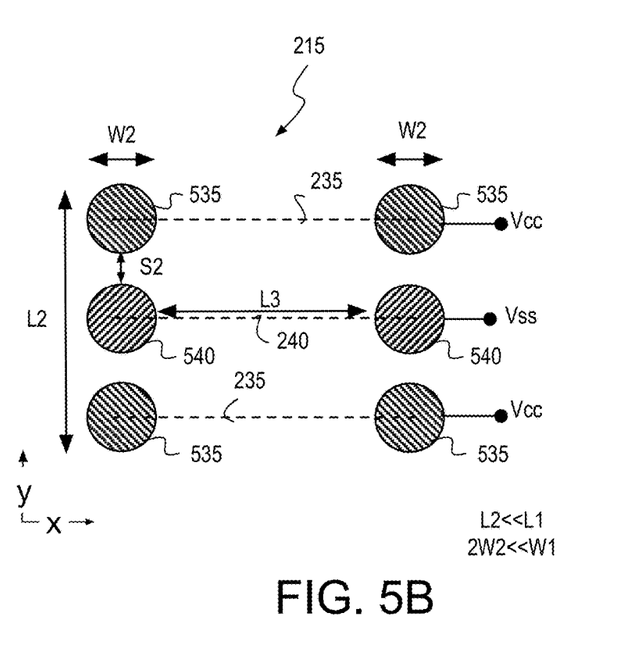
FIG. 5B is a schematic illustrating the footprint of in-mold capacitors, in accordance with some embodiments.

FIG. 5A is a schematic illustrating the footprint of die-side capacitor 120, in accordance with convention. For comparison, FIG. 5B is a schematic illustrating the footprint of embedded capacitor 215, in accordance with some embodiments. Referring first to FIG. 5A, die-side capacitor 120 requires a footprint, or area, of approximately length L1 multiplied with width W1. Width W1 is associated with a nominal SMT terminal pad 525 dimension, which may be 600-700 µm, for example. Length L1 is approximately twice the terminal pad width W1, summed with pad spacing S1 (e.g., 60 µm), and a nominal length of the capacitor 120, that further depends on the capacitance rating. For an exemplary decoupling capacitor having a 0.22 µF rating, L1 may be 1200-1500 µm for a package area per component of approximately 0.85 mm$^2$.

In reference to FIG. 5B, dimensions of substrate lands 535, 540 to which embedded capacitor 215 may contact is reduced to a width W2 having a spacing of S2. In some exemplary embodiments width W2 is between 50 and 70 µm (e.g., 60 µm) while spacing S2 is 5-30 µm (e.g., 20 µm). This reduction is possible at least in part because of the techniques employed to fabricate embedded capacitor 215, for example as described further below. Length L2 may therefore be approximately 220 µm. With lands at opposite ends of embedded capacitor 215, package area per component may be reduced to approximately 0.05 mm$^2$ for the 0.22 µF rating assuming relative permittivity of 15,000, plates 240, 235 have a length L3 of 10 mm, and a depth (D1 in FIG. 3B) of 400 µm.

Hence, capacitors embedded in-mold according to one or more of the embodiments herein may improve package routing density through reduction and/or elimination of bulky package contact lands (pads) on package substrate that are needed for conventional die-side capacitor placement. Removal of the bulky package contact lands increases the area available to I/O and power trace routing escape/break-out routing from an IC chip. Package trace metallization layer count may therefore also be reduced. Similarly, solder BGA I/O density may be increased where land-side capacitors are replaced with embedded capacitors. For example, embedded capacitors may enable a solder BGA to be fully populated across the package land side. Power integrity may also be enhanced through shorter decoupling inductive loops between an embedded decoupling capacitor and an IC transceiver power load.

Figure 6A:
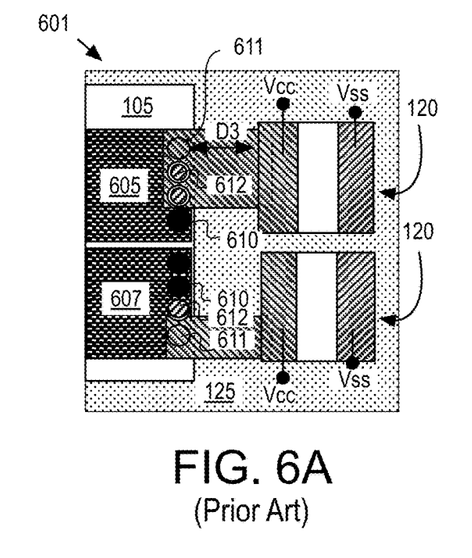
FIG. 6A is a top-down plan view of a package assembly showing routing of die-side decoupling capacitors, in accordance with convention.
Figure 6B:
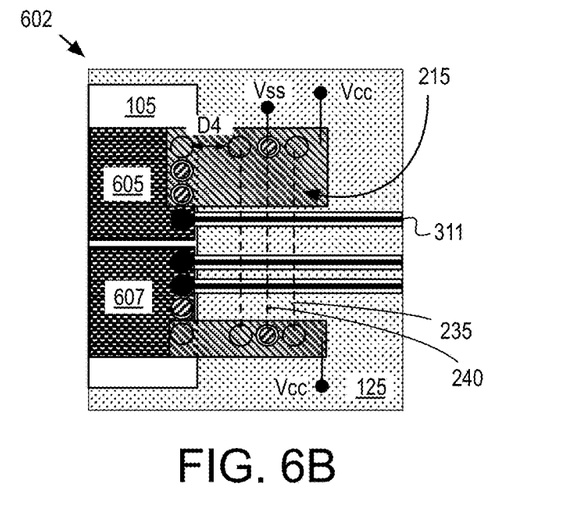
FIG. 6B is a top-down plan view of a package assembly showing routing of an in-mold decoupling capacitor, in accordance with some embodiments.

FIG. 6A is a top-down plan view of a package assembly 601 showing routing of die-side decoupling capacitors 120, in accordance with convention. For comparison, FIG. 6B is a top-down plan view of a package assembly 602 showing routing of embedded decoupling capacitor 215, in accordance with some embodiments. Referring first to FIG. 6A, first circuitry block 605 includes one or more signal bumps 610, power rail ($V_{cc}$) bumps 611, and ground ($V_{ss}$) bumps 612. A trace and/or plane in a first package routing metallization layer spans distance D3 to couple IC power bump 611 to the $V_{cc}$ terminal pad of a first die-side capacitor 120. Second circuitry block 607 also includes one or more signal bumps 610, power rail ($V_{cc}$) bumps 611, and ground ($V_{ss}$) bumps 612. A second die-side capacitor 120 is coupled to circuitry block 607. As shown in FIG. 6A, there is limited room for a trace in the first package routing metallization layer to couple circuitry blocks 605, 607 to the second terminal of capacitors 120. Likewise, there is limited room for a trace in the first package routing metallization layer to break out signal bumps 610. Additional package routing metallization layers are therefore needed.

Circuitry blocks 605 and 607 are also illustrated in FIG. 6B along with their ground, signal and power bumps substantially as described above. Embedded capacitor 215, however, is configured to support a common power rail for both circuitry blocks 605 and 607. This configuration reduces the footprint associated with having the two separate die-side capacitors 120. Decoupling loop inductance is also reduced for assembly 602 as distance D4 spanned by a trace and/or plane in the first package routing metallization layer is smaller than D1. Vertical separation between metal places of embedded capacitor 215 and the first package routing metallization layer (e.g., a partial thickness of molding compound and/or solder resist) also enables additional traces 311 in the first package routing metallization layer to be utilized for signal I/O breakout.

Figure 7:
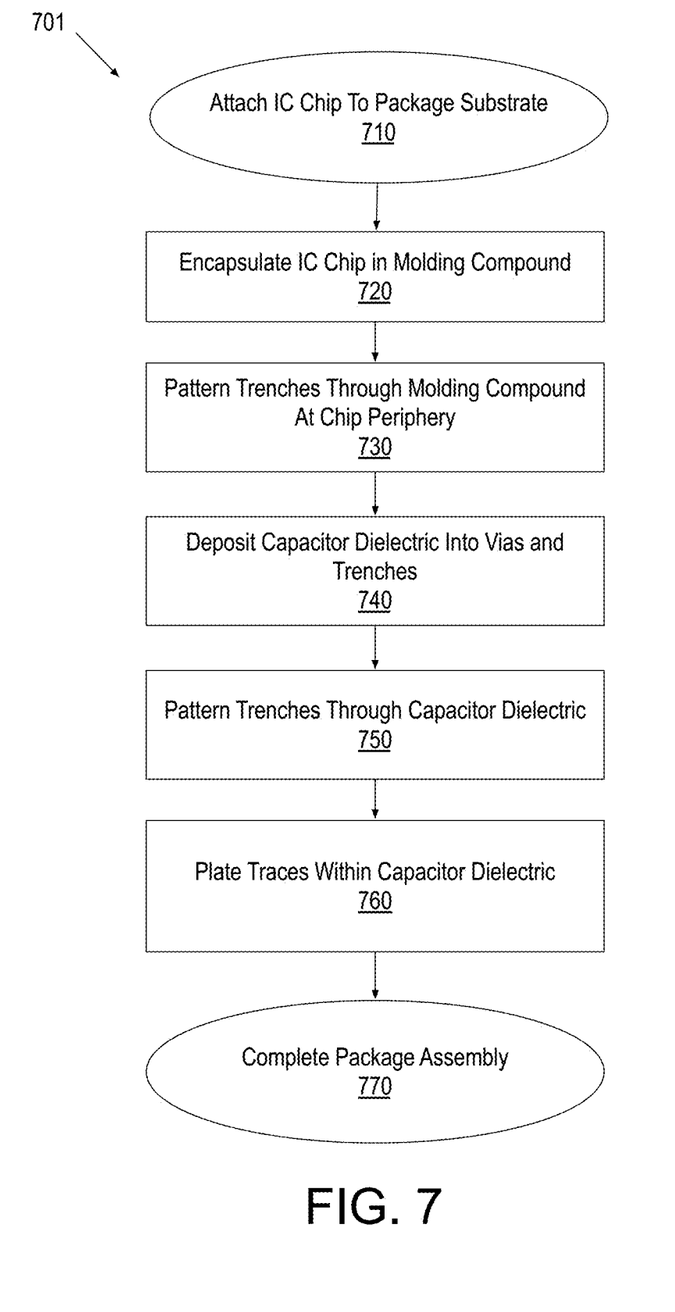
FIG. 7 is a flow diagram illustrating methods of fabricating an IC in an over-molded package assembly with embedded decoupling capacitors, in accordance with some embodiments.

The package assemblies described above may be fabricated using a variety of methods. FIG. 7 is a flow diagram illustrating some exemplary methods 701 for fabricating an IC in an over-molded package with an in-mold capacitor, in accordance with some embodiments. FIGS. 8A, 8B, 8C, 8D, 8E, and 8F are cross-sectional views of an IC in an over-molded package with an embedded capacitor evolving as selected operations of the methods 701 are performed, in accordance with some illustrative embodiments.

Figure 8A:
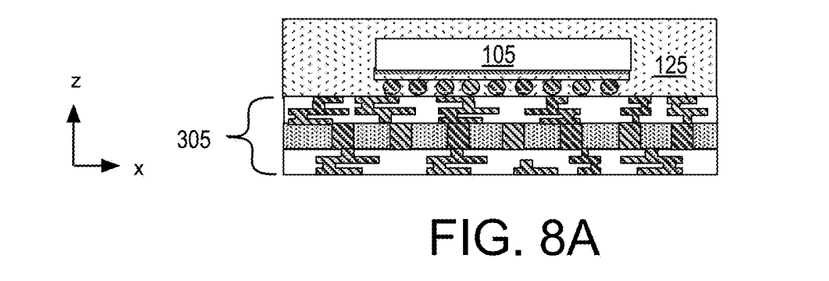
FIGS. 8A, 8B, 8C, 8D, 8E and 8F are cross-sectional views of an IC in an over-molded package assembly evolving as selected operations of the method in FIG. 7 are performed, in accordance with some embodiments.

Referring first to FIG. 7, methods 701 begin at operation 710 where IC chips are attached to a package substrate or, alternatively, to a carrier. Singulated, known-good chips may be mounted upon the package substrate(s), for example with any suitable pick-and-place technique. Methods 701 continue at operation 720 where the IC chips attached to the substrate (or a carrier) are encapsulated in molding compound. Any over-molding process may be employed at operation 720, such as, but not limited to an injection molding process, and/or a compression molding process, and/or a transfer molding process. FIG. 8A further illustrates IC chips 105 following encapsulation within molding compound 125.

Figure 8B:
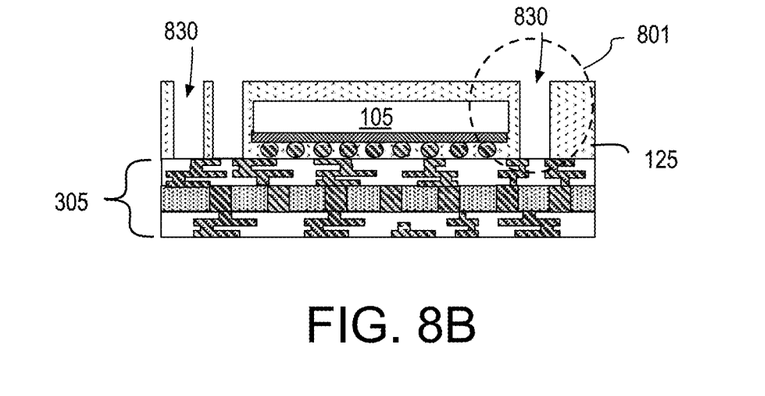

Returning to FIG. 7, methods 701 continue at operation 730 where trenches are patterned into the peripheral portion of the molding compound. Depending on the molding compound composition, operation 730 may include one or more of UV exposure, or laser ablation, for example. Laser ablation may be with any suitable pico-second or femto-second laser, for example. Etching/ablation times or scan rates may be selected to form through-mold trenches that expose the underlying carrier or package substrate, or in the alternative, to form shallower trenches that do not extend the full depth of the molding compound. Scan rates may be varied over a scan path to modulate the depth of a trench, if desired (e.g., to have portions of the trench extend through the mold while other portions of the trench do not extend through the molding compound). The trench patterning process may stop on a surface of the substrate, for example on, or somewhere within, a solder resist layer of the substrate. FIG. 8B further illustrates through-mold trenches 830 formed within a peripheral portion of molding compound 125. Trenches 830 may be formed concurrently (e.g., with multi-beam laser source) or scanned serially. Beams with different spot sizes may be employed where trenches 830 are to be of a different lateral dimensions. The width (e.g., x-dimension) of the trenches 830 may therefore vary from tens of microns to hundreds of microns. In some exemplary embodiments, the trench width is between 70 and 150 µm.

Figure 8C:
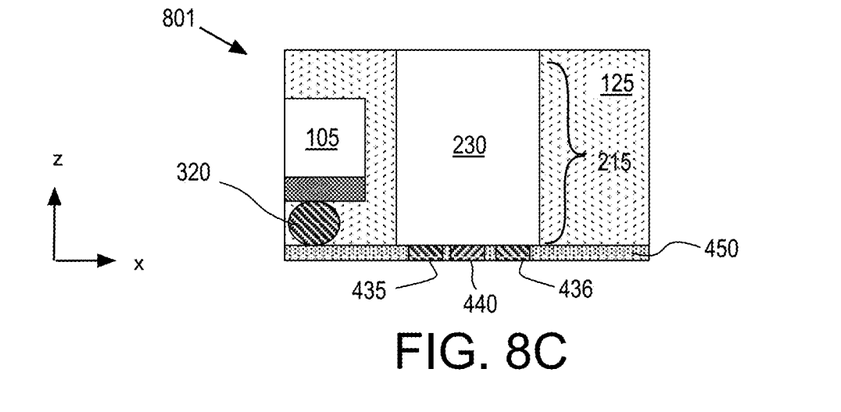

Returning to FIG. 7, methods 701 continue at operation 740 where the mold layer trenches are backfilled with a dielectric material having a relative permittivity suitable for capacitor fabrication. Any technique known to be suitable for depositing the chosen dielectric material may be performed at operation 740, such as, but not limited to molding, printing and sputtering processes. The deposited material may then be planarized using any suitable technique (e.g. polishing, lapping, and/or grinding). FIG. 8C further illustrates an expanded view 801 showing dielectric material 230 back-filling trenches 830. At this point in the processing, portions of molding compound 125 have been replaced with capacitor dielectric material 230.

Figure 8D:
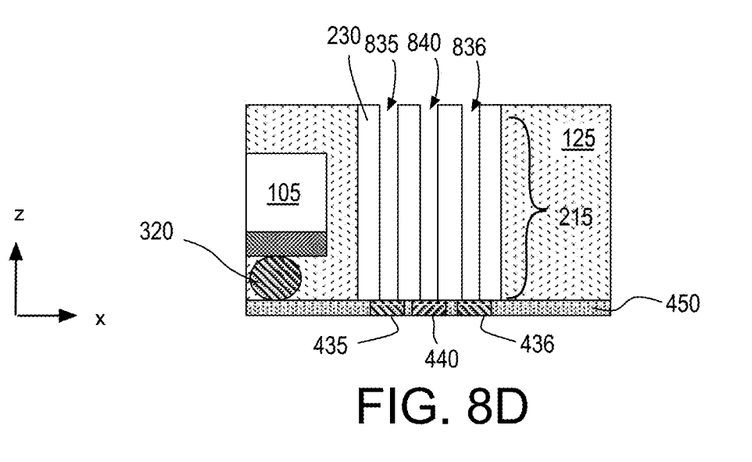

Returning to FIG. 7, methods 701 continue at operation 750 where trenches are patterned into the capacitor dielectric. Operation 750 may include a laser ablation and/or etching operation, for example. A pico-second or femto-second laser may be employed, for example. Power levels and scan rates may be selected to form through-dielectric trenches that expose the underlying pads of the package substrate. Scan rates may be varied over a scan path to modulate the depth of a trench, if desired (e.g., to have portions of the trench extend through the capacitor dielectric while other portions of the trench do not extend through the capacitor dielectric). Some or all of the trench patterning process may stop on a surface of the substrate, for example exposing substrate pads that are free of solder resist. FIG. 8D further illustrates through-dielectric trenches 835, 836 and 840. Trenches 835-840 may be formed concurrently (e.g., with multi-beam laser source), or scanned serially. The width (e.g., x-dimension) of the trenches 835-840 is less than that of trenches 830 and may vary with implementation. In some exemplary embodiments, the trench width is between 10 and 40 µm. Depending on the thickness of molding compound 125, the aspect ratio of trench 835-840 may be 5:1 to 10:1, or more. As shown, trench 835 exposes substrate land 435, trench 836 exposes substrate land 436, and trench 840 exposes substrate land 440.

Figure 8E:
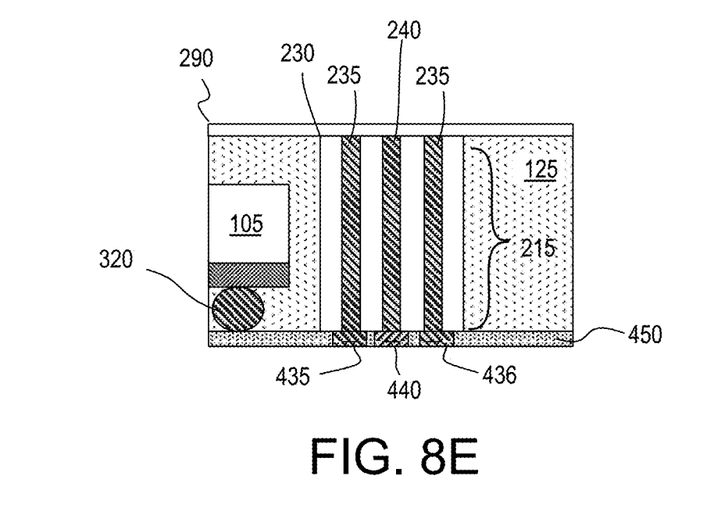

Returning to FIG. 7, methods 701 continue at operation 760 where metal is deposited into the capacitor plate trenches. In some example embodiments, operation 760 entails an electrolytic and/or electroless plating process. Any such plating process know to be suitable for the metal may be employed, for example to backfill open trenches with Cu or a Cu alloy. A seed layer of any suitable metal may be employed. The seed layer may be patterned by any known technique, and a selective plating process may then performed to selectively deposit metal into the trenches. Any metal overburden plated over a top surface of the molding compound may be polished or lapped back to planarize the plated metal with the molding compound and form separate capacitor plates. FIG. 8E illustrates one example where capacitor trenches 835-840 (FIG. 8D) have been metal-filled to form metal plates 235-240. Following the metal-fill, a protective dielectric material 290 may be deposited over the embedded capacitor plates.

Figure 8F:
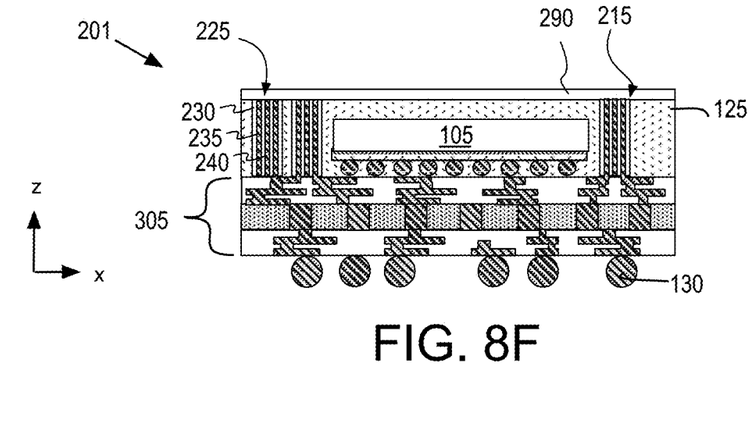

Returning to FIG. 7, methods 701 continue at operation 770 where the package assembly is completed. A carrier employed in the over-mold operation(s) may be removed at operation 770, for example, and any suitable techniques may be employed to build up metallization levels on a surface of the IC chips exposed upon removal of the carrier. Such a build-up may include plating redistribution lines to exposed portions of the metal plates embedded within the molding compound. A BGA may then fabricated in preparation for mounting the package assembly to a host. In alternative embodiments, where a package substrate is employed, operation 770 may entail attaching the BGA on the package substrate. FIG. 8F further illustrates the attachment of solder balls 130 on a land side of package substrate 305, for example by any suitable surface mounting or solder reflow process. Package assemblies may then be singulated with any suitable singulation process (e.g., sawing, scribing, or laser ablation processes).

Figure 9:
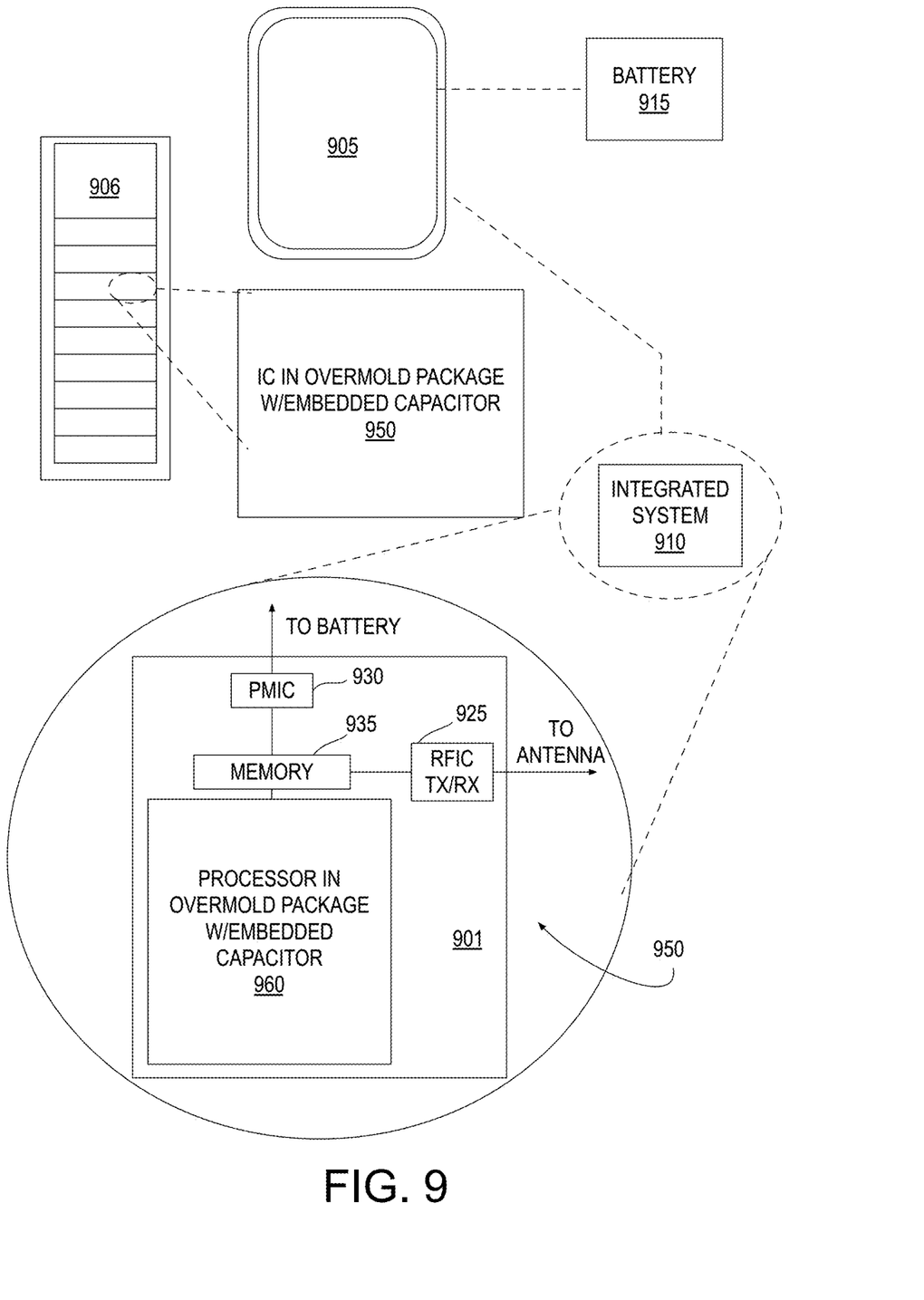
FIG. 9 illustrates a mobile computing platform and a data server machine employing an IC with an over-molded package assembly including embedded capacitors, in accordance with some embodiments.

FIG. 9 illustrates a mobile computing platform and a data server machine employing an IC chip contained within an over-molded IC package with an embedded decoupling capacitor, for example as described elsewhere herein. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

As a system component within the server machine 906, SoC 950 may include a memory block (e.g., RAM) and a processor block (e.g., a microprocessor, a multi-core microprocessor, graphics processor, or the like) contained within an over-molded IC package with an embedded capacitor, for example as described elsewhere herein. SoC 950 includes a substrate 901 to which one or more of a power management integrated circuit (PMIC) 930, RF (wireless) integrated circuit (RFIC) 925 including a wideband RF (wireless) transmitter and/or receiver (TX/RX), a processor 960 and memory 935 are interconnected through BGA solder connections. In some embodiments RFIC 925 is connected to an embedded decoupling capacitor, for examples having one or more of the features described elsewhere herein.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 950.

Figure 10:
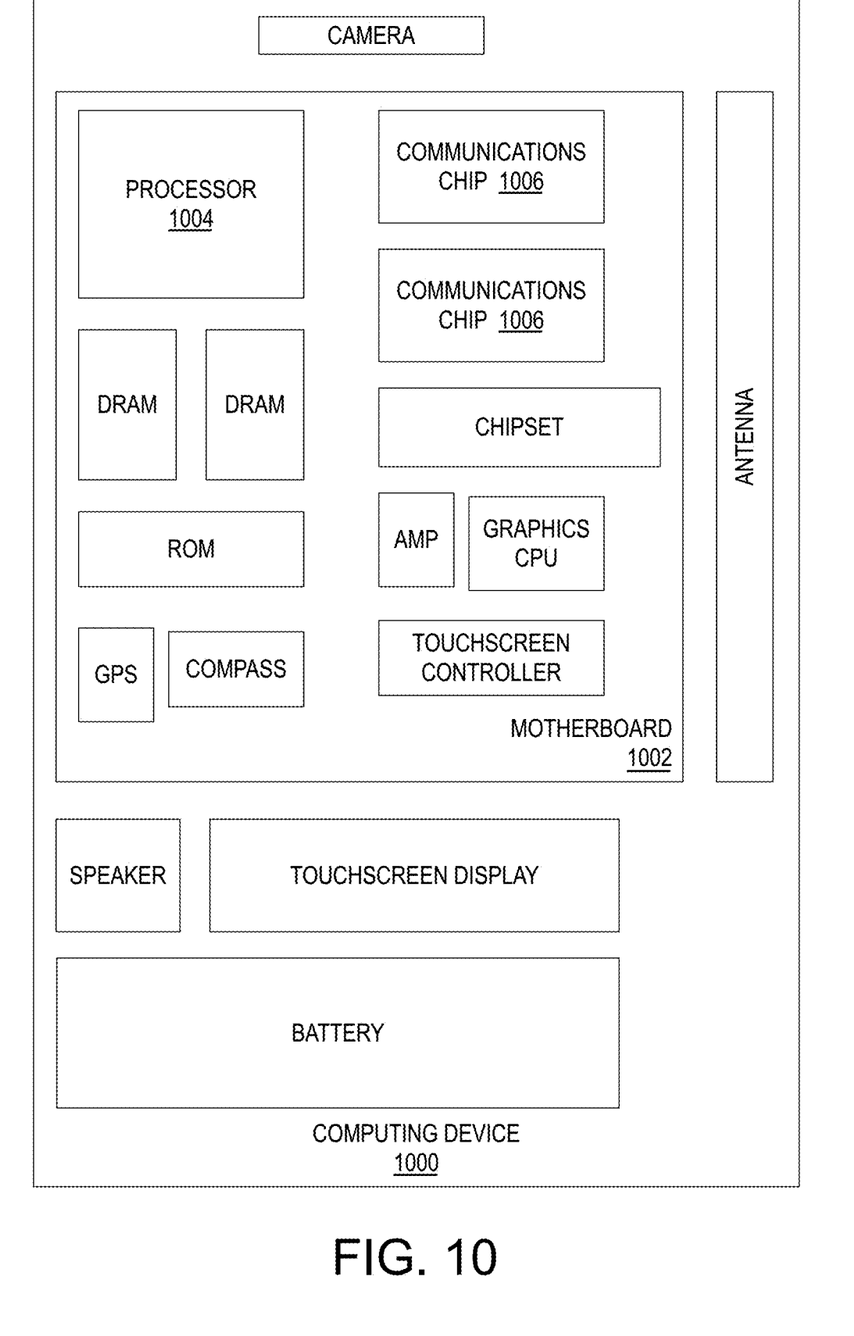
FIG. 10 is a functional block diagram of an electronic computing device, in accordance with some embodiments.

FIG. 10 is a functional block diagram of an electronic computing device, in accordance with some embodiments. Computing device 1000 may be found inside platform 905 or server machine 906, for example. Device 1000 further includes a motherboard 1002 hosting a number of components, such as, but not limited to, a processor 1004 (e.g., an applications processor), which may be contained within an over-molded IC package with an embedded reference voltage plane or heater spreader, for example as described elsewhere herein. Processor 1004 may be physically and/or electrically coupled to motherboard 1002. In some examples, processor 1004 includes an integrated circuit die, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a microelectronic device package assembly comprises an integrated circuit (IC) chip, a molding compound surrounding the IC chip, wherein a peripheral portion of the molding compound extends beyond edges of the IC chip, one or more first trenches passing through a thickness of the peripheral portion of the molding compound, a dielectric material embedded within the first trenches, and two or more metal capacitor plates embedded within two or more second trenches passing through a thickness of the dielectric material, the metal plates separated by the dielectric material.

In one or more second examples, for any of the first examples a package assembly further includes one or more metal redistribution layers or a package substrate coupled to the IC chip. Individual ones of the second trenches expose conductive lands of the metal redistribution layers or the package substrate, and each of the two or more plates contacts a separate one of the lands.

In one or more third examples, for any of the second examples a first of the first trenches exposes four or more conductive lands, a first pair of the lands proximal to a first end of the first of the second trenches and a second pair of the lands proximal to a second end of the first of the second trenches. A first of the metal plates contacts one of the first pair of lands and contacts one of the second pair of lands. A second of the metal plates contacts another of the first pair of lands and contacts another of the second pair of lands.

In one or more fourth examples, for any of the first through third examples the two or more plates are separated from the molding compound by the dielectric material.

In one or more fifth examples, for any of the first through fourth examples the dielectric material has a relative permittivity greater than that of the molding compound.

In one or more sixth examples, for any of the first through fifth examples the two or more metal plates further comprise three metal plates embedded within each of the second trenches, a center one of the three metal plates coupled to a ground plane of the metal redistribution layers or package substrate.

In one or more seventh examples, for any of the sixth examples the remaining two metal plates are coupled to one or more power planes of the metal redistribution layers or package substrate.

In one or more eighth examples, for any of the sixth examples a first of the first trenches exposes six conductive lands, a first set of three lands proximal to a first end of the first trench and a second set of three lands proximal to a second end of the first trench. A first of the metal plates contacts a first of the lands in each of the first and second sets of lands. A second of the metal plates contacts a second of the lands in each of the first and second sets of lands. A third of the metal plates contacts a third of the lands in each of the first and second sets of lands.

In one or more ninth examples, for any of the second examples the metal redistribution layers or a package substrate further comprise a signal routing trace coupled to the IC and intersecting one or more of the trenches, the signal routing trace separated from the two or more metal plates by one or more dielectric material layer.

In one or more tenth examples, for any of the first through ninth examples the metal plates comprise interdigitated fingers.

In one or more eleventh examples, for any of the first through tenth examples the metal plates have a height substantially equal to a thickness of the molding compound along at least a portion of the length of the plates.

In one or more twelfth examples, for any of the first through eleventh examples the package assembly further comprises a dielectric encapsulant layer over the metal plates and the molding compound, the dielectric encapsulant layer have a composition different than the molding compound.

In one or more thirteenth examples, a microelectronic device comprises a system on a chip (SoC) including first circuitry and second circuitry, a memory, a battery, and a decoupling capacitor electrically coupled between the battery and the SoC, wherein the SOC is embedded within a molding compound, and the decoupling capacitor is embedded within a trench in a peripheral portion of the molding compound that extends beyond edges of the SoC. The decoupling capacitor further comprises three or more metal plates embedded within a dielectric material contained within the trench, the dielectric material having a different composition than the molding compound.

In one or more fourteenth examples, for any of the thirteenth examples a first of the metal plates is coupled to a ground plane of both the first and second circuitry, and a second and a third of the metal plates are coupled to a power plane of both the first and second circuitry.

In one or more fifteenth examples, a method of fabricating a microelectronic package assembly comprises encapsulating an IC chip in a molding compound, patterning a first trench through a peripheral portion of the molding compound located beyond an edge of the IC chip, filling the trench with a dielectric material, patterning two or more second trenches through the dielectric material, and forming two or more metal plates of an embedded capacitor by at least partially filling the two or more second trenches with a metal.

In one or more sixteenth examples, for any of the fifteenth examples patterning the first trench further comprises laser ablating features into the molding compound, and patterning the two or more second trenches further comprises laser ablating features into the dielectric material.

In one or more seventeenth examples, for any of the sixteenth examples laser ablating features into the dielectric material further comprises ablating to a first depth at opposite ends of the second trenches and ablating to a second depth, less than the first, between the opposite ends.

In one or more eighteenth examples, for any of the fifteenth through seventeenth examples at least partially filling the two or more trenches with a metal further comprises depositing a conductive seed layer, plating the metal onto the seed layer, and planarizing a top surface of the metal with a top surface of the molding compound.

In one or more nineteenth examples, for any of the fifteenth through eighteenth examples the method further comprises flip-chip attaching a front-side of the IC chip, opposite the molding compound, to a package substrate prior to encapsulating the IC chip in the molding compound, wherein one or more of the metal plates contacts a metal land on the package substrate.

In one or more twentieth examples, for any of the fifteenth through nineteenth examples the method further comprises depositing a dielectric protection layer over the metal traces.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the disclosure should, therefore, be determined with reference to the appended claims, along with the full scope of equivalents to which such claims are entitled.

What is claimed is:

1. A microelectronic device package assembly, comprising:
   an integrated circuit (IC) chip;
   a package material laterally adjacent to an edge of the IC chip, wherein the package material is a first dielectric material of a first composition with a first relative permittivity;
   a second dielectric material within a trench in the package material, wherein the second dielectric material is of a second composition, different than the first composition, and with a second relative permittivity of at least 10,000;
   a plurality of metal capacitor plates within the second dielectric material, wherein the second dielectric material is between laterally adjacent ones of the metal capacitor plates and wherein all of the metal capacitor plates are separated from the package material by the second dielectric material; and
   one or more metal redistribution layers or a package substrate coupled to the IC chip, the metal redistribution layers or the package substrate including a plurality of conductive lands, and wherein individual ones of the metal capacitor plates are in direct contact with at least one of the conductive lands.

2. The package assembly of claim 1, wherein:
   a first end of a first of the metal capacitor plates is in contact with a first of the lands;
   a first end of a second of the metal capacitor plates is in contact with a second of the lands, the second of the lands laterally adjacent to the first of the lands;
   a second end of the first of the metal capacitor plates is in contact with a third of the lands; and
   a second end of the second of the metal capacitor plates is in contact a fourth of the lands, the fourth of the lands laterally adjacent to the third of the lands.

3. The package assembly of claim 1, wherein the second dielectric material comprises calcium copper titanium oxide, and the package material comprises an epoxy resin silicone, or composite thereof.

4. The package assembly of claim 1, wherein a trace in the metal redistribution layers or the package substrate crosses under the plurality of metal capacitor plates, and wherein the package material is between the trace and the plurality of metal capacitor plates.

5. The package assembly of claim 4, wherein a first portion of the metal capacitor plates over the trace has a first depth, and a second portion of the metal capacitor plates in contact with the lands has a second depth, greater than the first, wherein the second depth is substantially equal to a thickness of the package material, and wherein the thickness of the package material is at least equal to that of the IC chip.

6. The package assembly of claim 1, wherein the package material is a first package material having the first composition, and wherein the package assembly further comprises a second package material over the metal capacitor plates, over the second dielectric material, and over the first package material, wherein the second package material is a third dielectric material having a third composition, different than the first composition.

7. A microelectronic device, comprising:
   the package assembly of claim 1;
   a memory;
   a battery; and
   a capacitor electrically coupled between the battery and the IC die, wherein the capacitor comprises the metal capacitor plates and the second dielectric material.

8. The device of claim 7, wherein:
   a first of the metal capacitor plates is coupled to a ground plane of both a first circuitry block and a second circuitry block; and
   a second and a third of the metal capacitor plates are coupled to a power plane of both the first circuitry block and the second circuitry block.

* * * * *